(12) United States Patent
Chen

(10) Patent No.: US 9,209,780 B2
(45) Date of Patent: Dec. 8, 2015

(54) PIEZOELECTRIC OSCILLATOR

(71) Applicant: NIHON DEMPA KOGYO CO., LTD., Tokyo (JP)

(72) Inventor: Wen Jen Chen, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/474,183

(22) Filed: Sep. 1, 2014

(65) Prior Publication Data

US 2015/0145613 A1    May 28, 2015

(30) Foreign Application Priority Data

Nov. 28, 2013   (JP) .................................. 2013-245895

(51) Int. Cl.
*H03H 9/05*   (2006.01)
*H03H 9/17*   (2006.01)
*H03B 5/32*   (2006.01)
*H03B 1/02*   (2006.01)

(52) U.S. Cl.
CPC .............. *H03H 9/0552* (2013.01); *H03B 1/02* (2013.01); *H03B 5/32* (2013.01); *H03H 9/17* (2013.01); *H03B 2200/0014* (2013.01)

(58) Field of Classification Search
CPC .............. H03B 1/02; H03B 5/32; H03B 5/36; H03B 5/02; H03B 2200/0014; H03B 2200/0068

USPC ........................... 331/116 R, 116 FE, 158, 68
See application file for complete search history.

(56) References Cited

U.S. PATENT DOCUMENTS

| | | | |
|---|---|---|---|
| 6,229,249 B1 * | 5/2001 | Hatanaka et al. | 310/348 |
| 6,229,404 B1 * | 5/2001 | Hatanaka | 331/68 |
| 7,242,258 B2 * | 7/2007 | Hatanaka et al. | 331/68 |

FOREIGN PATENT DOCUMENTS

| | | |
|---|---|---|
| JP | 2012-142700 | 7/2012 |
| JP | 2013-118733 | 6/2013 |
| JP | 2013219704 A * | 10/2013 |

* cited by examiner

*Primary Examiner* — Ryan Johnson
(74) *Attorney, Agent, or Firm* — Jianq Chyun IP Office

(57) ABSTRACT

A piezoelectric oscillator includes a piezoelectric vibrating piece, an integrated circuit, and a package. The package includes a first layer, a second layer, a third layer, and a fourth layer. The ceiling surface as a portion of the inferior surface of the third layer has a rectangular shape surrounded by short sides and long sides. The ceiling surface includes a pair of frequency checking terminals electrically connected to the connecting electrodes and control terminals to control the integrated circuit. The pair of the frequency checking terminal are adjacent to one another. The respective frequency checking terminals are disposed in contact with any of the long sides and one of the short sides. The control terminals are extracted to the top surface of the third layer, and overlap the frequency checking terminals in a vertical direction on the top surface of the third layer to be connected to the mounting terminals.

4 Claims, 7 Drawing Sheets

PIEZOELECTRIC OSCILLATOR

CROSS-REFERENCE TO RELATED APPLICATIONS

This application claims the priority benefit of Japanese application serial no. 2013-245895, filed on Nov. 28, 2013. The entirety of the above-mentioned patent application is hereby incorporated by reference herein and made a part of this specification.

TECHNICAL FIELD

This disclosure relates to a piezoelectric oscillator that includes a piezoelectric vibrating piece and an integrated circuit.

DESCRIPTION OF THE RELATED ART

There is known a piezoelectric vibrating piece that includes excitation electrodes on both the principal surfaces, and vibrates at a predetermined frequency. Such a piezoelectric vibrating piece is placed in a package with an oscillator circuit to form a piezoelectric oscillator.

For example, Japanese Unexamined Patent Application Publication No. 2012-142700 (hereinafter referred to as Patent Literature 1) discloses a package that includes a first depressed space, where a piezoelectric vibrating piece is placed, and a second depressed space, where an integrated circuit device is placed. The first depressed space and the second depressed space are separated from each other, and a piezoelectric vibration element measuring pad, which is electrically connected to an excitation electrode of the piezoelectric vibrating piece, is placed in the second depressed space. This allows to measure a frequency of the piezoelectric vibrating piece via the piezoelectric vibration element measuring pad after the piezoelectric vibrating piece is placed in the package and before the integrated circuit device is placed in the package.

In Patent Literature 1, however, the piezoelectric vibration element measuring pad is placed at the center of an oscillator circuit placement surface in the second space, and other various terminals are disposed around the piezoelectric vibration element measuring pad, therefore a frequency measuring probe may contact other terminals during measurement of a frequency of the piezoelectric vibrating piece, and then wrongly measures a frequency. In addition, if a normal product is determined as a disqualified product due to a contact error between the piezoelectric vibration element measuring pad and the frequency measuring probe, a production efficiency of the product may decrease, which may increase the costs. Especially, recent downsizing of a piezoelectric oscillator results in a small area of forming surface for a piezoelectric vibration element measuring pad, which increases the possibility of a wrong measurement and a contact error.

A need thus exists for a piezoelectric oscillator which is not susceptible to the drawbacks mentioned above.

SUMMARY

A piezoelectric oscillator according to a first aspect of the disclosure includes a piezoelectric vibrating piece, an integrated circuit, and a package. The piezoelectric vibrating piece has a flat rectangular shape. The piezoelectric vibrating piece includes a pair of excitation electrodes and a pair of extraction electrodes disposed on principal surfaces of the piezoelectric vibrating piece. Each of the extraction electrodes is extracted from each of the excitation electrodes to one side of the flat rectangular shape. The integrated circuit is configured to cause the piezoelectric vibrating piece to oscillate at a predetermined frequency. The package has a first space where the piezoelectric vibrating piece is placed, and a second space where the integrated circuit device is placed. The package includes a first layer, a second layer, a third layer, and a fourth layer. The first layer forms a side surface of the first space. The second layer is disposed on an inferior surface of the first layer to form a bottom surface of the first space. A pair of connecting electrodes is disposed on the bottom surface. The pair of connecting electrodes is electrically connected to the respective extraction electrodes of the piezoelectric vibrating piece. The third layer is disposed on the inferior surface of the second layer to form a ceiling surface of the second space. The integrated circuit is placed on the ceiling surface. The fourth layer is disposed on the inferior surface of the third layer to form a side surface of the second space. A plurality of mounting terminals are disposed on the inferior surface. The ceiling surface of the second space as a portion of the inferior surface of the third layer has a rectangular shape surrounded by short sides and long sides. The ceiling surface includes a pair of frequency checking terminals electrically connected to the connecting electrodes and control terminals to control the integrated circuit. The pair of the frequency checking terminals are adjacent to one another. The respective frequency checking terminals are disposed in contact with any of the long sides and one of the short sides. The control terminals are extracted to the top surface of the third layer, and then overlap the frequency checking terminals in a vertical direction on the top surface of the third layer to be connected to the mounting terminals.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

The following description describes the embodiments of this disclosure with reference to the drawings. It will be understood that the scope of the disclosure is not limited to the described embodiments, unless otherwise stated.

Configuration of Piezoelectric Oscillator 100

Figure 1:
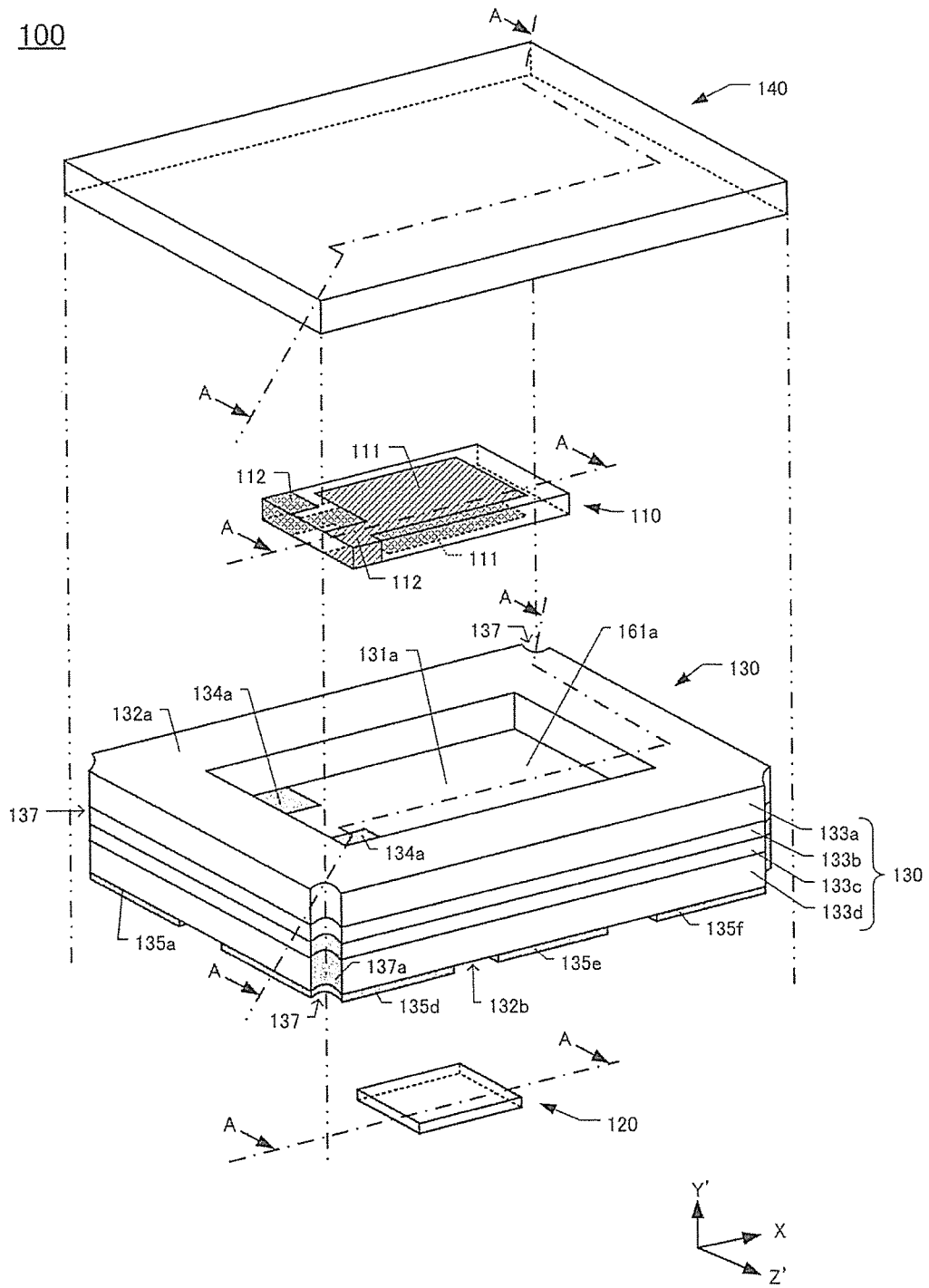
FIG. 1 is a schematic perspective view illustrating a piezoelectric oscillator 100 according to an embodiment of the disclosure.

FIG. 1 is a schematic perspective view illustrating a piezoelectric oscillator 100. The piezoelectric oscillator 100 includes a piezoelectric vibrating piece 110, an integrated circuit 120, a package 130, and a lid plate 140. For example, an AT-cut quartz-crystal vibrating piece is used as the piezoelectric vibrating piece 110. The AT-cut quartz-crystal vibrating piece has a principal surface (Y-Z plane) which is inclined by 35° 15' from the Z-axis toward the Y-axis direction about the X-axis with respect to the Y-axis of the crystallographic axis (XYZ). The following description will be given with new axes, a Y'-axis and a Z'-axis, inclined with respect to the axial directions of the AT-cut quartz-crystal vibrating piece as a reference. Namely, in the piezoelectric oscillator 100, the longitudinal direction of the piezoelectric oscillator 100 is an X-axis direction, the height direction of the piezoelectric oscillator 100 is the Y'-axis direction, and the direction perpendicular to the X-axis direction and Y'-axis direction is the Z'-axis direction.

The piezoelectric vibrating piece 110 has a flat rectangular shape, and includes excitation electrodes 111 and extraction electrodes 112. The respective excitation electrodes 111 are disposed on the surface at the +Y'-axis side and on the surface at the −Y'-axis side. From these excitation electrodes 111, the extraction electrodes 112 are respectively extracted to a side at the −X-axis side of the piezoelectric vibrating piece 110. The extraction electrode 112 extracted from the excitation electrode 111 on the surface at the +Y'-axis side extends to the +Z'-axis and −X-axis side, and then extends to the surface at the −Y'-axis side via a side surface at the +Z'-axis side. The extraction electrode 112 extracted from the excitation electrode 111 on the surface at the −Y'-axis side extends to the −Z'-axis and −X-axis side, and then extends to the surface at the +Y'-axis side via a side surface at the −Z'-axis side.

The integrated circuit 120 is electrically connected to the piezoelectric vibrating piece 110 to form an electric circuit, and causes the piezoelectric vibrating piece 110 to oscillate at a predetermined frequency. On the surface at the +Y'-axis side of the integrated circuit 120, a plurality of terminals 121 to 126 are disposed (see FIG. 3A), and these terminals are electrically connected to electrodes 138a to 138h (see FIG. 3B) disposed on the extraction electrode 112 of the piezoelectric vibrating piece 110 or on the surface at the −Y'-axis side of the package 130.

The package 130 has the long side, which extends in the X-axis direction, and the short side, which extends in the Z'-axis direction. Also, the package 130 includes a bonding surface 132a and a first space 131a, which are disposed on the surface at the +Y'-axis side of the package 130, and a mounting surface 132b and the second space 131b, which are disposed on the surface at the −Y'-axis side of the package 130. The bonding surface 132a is a surface to be bonded to the lid plate 140. The first space 131a is formed by depressing the surface at the +Y'-axis side of the package 130 from the bonding surface 132a in the −Y'-axis direction. The mounting surface 132b is a surface for the piezoelectric oscillator 100 to be mounted to an external device. The second space 131b is formed by depressing the surface at the −Y'-axis side of the package 130 from the mounting surface 132b in the +Y'-axis direction (see FIG. 2). Further, at respective corners of the side surfaces of the package 130, castellations 137 are formed. The castellations 137 are depressed toward the inside of the package 130, and side surface electrodes 137a are formed on portions of the castellations 137. A pair of connecting terminals 134a are disposed on a bottom surface 161a, which is the surface at the −Y'-axis side of the first space 131a of the package 130, and then the piezoelectric vibrating piece 110 is placed on the bottom surface 161a of the first space 131a. Also, the integrated circuit 120 is placed in the second space 131b of the package 130. In addition, the package 130, for example, includes a ceramic as a base material, and is formed by stacking four layers including a first layer 133a, a second layer 133b, the third layer 133c, and a fourth layer 133d.

The lid plate 140 has a flat-plate shape, and is bonded to the bonding surface 132a of the package 130 via a sealing material 151 (see FIG. 2) to seal the first space 131a of the package 130.

Figure 2:
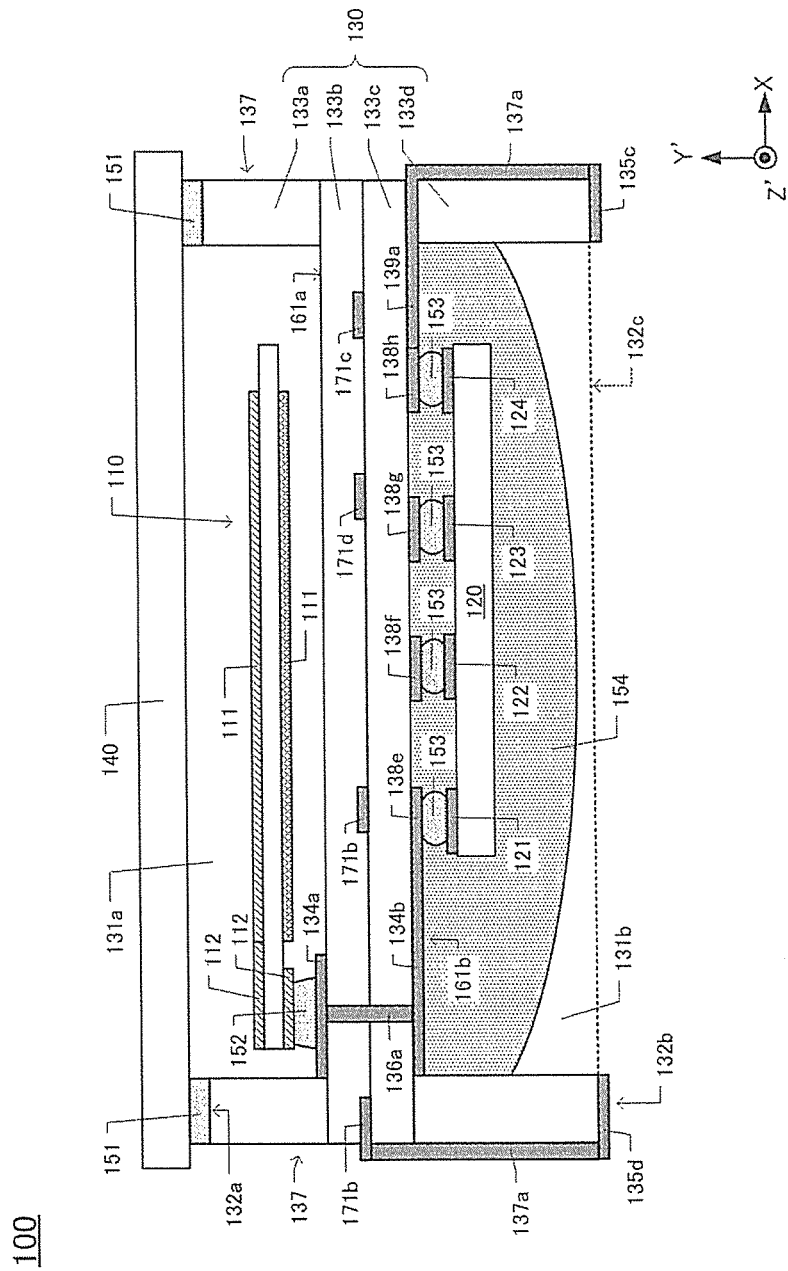
FIG. 2 is a cross-sectional view taken along the line A-A of FIG. 1.

FIG. 2 is a cross-sectional view taken along a line A-A of FIG. 1. Also, FIG. 2 includes A-A cross-sections of FIG. 3B, FIG. 4A, and FIG. 4B. The first layer 133a of the package 130 is disposed on the +Y'-axis side of the package 130 to form a side surface of the first space 131a. The bonding surface 132a is disposed on the surface at the +Y'-axis side of the first layer 133a.

The second layer 133b is bonded to the surface at the −Y'-axis side of the first layer 133a to form the bottom surface 161a of the first space 131a. The bottom surface 161a of the first space 131a is a surface at the −Y'-axis side of the first space 131a, and is a portion of a surface at the +Y'-axis side of the second layer 133b. A pair of connecting terminals 134a is disposed at the −X-axis side end of the bottom surface 161a. The piezoelectric vibrating piece 110 is placed on the bottom surface 161a by bonding the connecting terminals 134a to the extraction electrodes 112 via conductive adhesives 152.

The third layer 133c is bonded to a surface at the −Y'-axis side of the second layer 133b to form a ceiling surface 161b of the second space 131b. The ceiling surface 161b of the second space 131b is a surface at the +Y'-axis side of the second space 131b, and is a portion of a surface at the −Y'-axis side of the third layer 133c. On the ceiling surface 161b, a plurality of electrodes 138a to 138h are disposed (see FIG. 3B), and then the integrated circuit 120 is placed on the ceiling surface 161b by bonding the electrodes 138a to 138h to the respective terminals 121 to 126 of the integrated circuit 120 (see FIG. 3A) via bumps 153. On the surface at the +Y'-axis side of the third layer 133c, a first wiring electrode 171a to a fourth wiring electrode 171d are disposed (see FIG. 4B), the first wiring electrode 171a to the fourth wiring electrode 171d being extracted from the electrodes 138a to 138h disposed on the ceiling surface 161b.

The fourth layer 133d is bonded to a surface at the −Y'-axis side of the third layer 133c to form a side surface of the second space 131b. The mounting surface 132b is formed on the surface at the −Y'-axis side of the fourth layer 133d. On the mounting surface 132b, the mounting terminals 135a to 135f are disposed (see FIG. 3B). The mounting terminals 135a to 135f are electrically connected to the electrodes disposed on the third layer 133c via the side surface electrodes 137a formed on the castellations 137 or similar electrodes. The integrated circuit 120 is placed in the second space 131b, and the integrated circuit 120 is covered with the resin 154. The resin 154 is formed from an opening surface 132c of the second space 131b, which is in an identical plane with the mounting surface 132b without protruding to the −Y'-axis side.

Figure 3A:
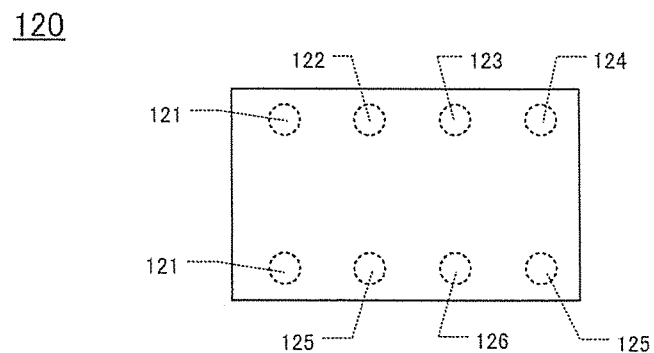
FIG. 3A is a bottom view illustrating an integrated circuit 120.

FIG. 3A is a bottom view illustrating the integrated circuit 120. The integrated circuit 120 includes totally eight terminals arranged in 4×2 matrix, in which four terminals are in the X-axis direction and two terminals are in the Z'-axis direction, on the surface at the +Y'-axis side. FIG. 3A illustrates the surface at the −Y'-axis side of the integrated circuit 120, and then the terminals disposed on the surface at the +Y'-axis side of the integrated circuit 120 are indicated as circles of dotted lines, the terminals being viewed through the integrated circuit 120. In FIG. 3A, on the ends at the −X-axis and +Z'-axis side, and at the −X-axis and −Z'-axis side of the integrated circuit 120, crystal terminals 121 are disposed, the crystal terminals 121 being respectively electrically connected to extraction electrodes 112 of the piezoelectric vibrating piece 110. Adjacently at the +X-axis side of the crystal terminal 121 at the +Z'-axis side, a power source terminal 122 is disposed, the power source terminal 122 being connected to a power source. Adjacently at the +X-axis side of the power source terminal 122, a switching terminal 123 is disposed. The switching terminal 123 switches between an active state and a pause state. The active state is a state to output a signal at a MHz band frequency while the pause state is a state not to output a signal at MHz band frequency. A terminal at the +X-axis side of the switching terminal 123 is a MHz band output terminal 124, which outputs a signal of a MHz band frequency. Also, adjacently at the +X-axis side of the crystal terminal 121 at the −Z'-axis side, a grounding terminal 125 is disposed, the grounding terminal 125 being grounded. Adjacently at the +X-axis side of the grounding terminal 125, a 32.768 kHz output terminal 126 is disposed, the output terminal 126 outputting a signal of a frequency of 32.768 kHz. Adjacently at the +X-axis side of the 32.768 kHz output terminal 126, the grounding terminal 125 is disposed.

Figure 3B:
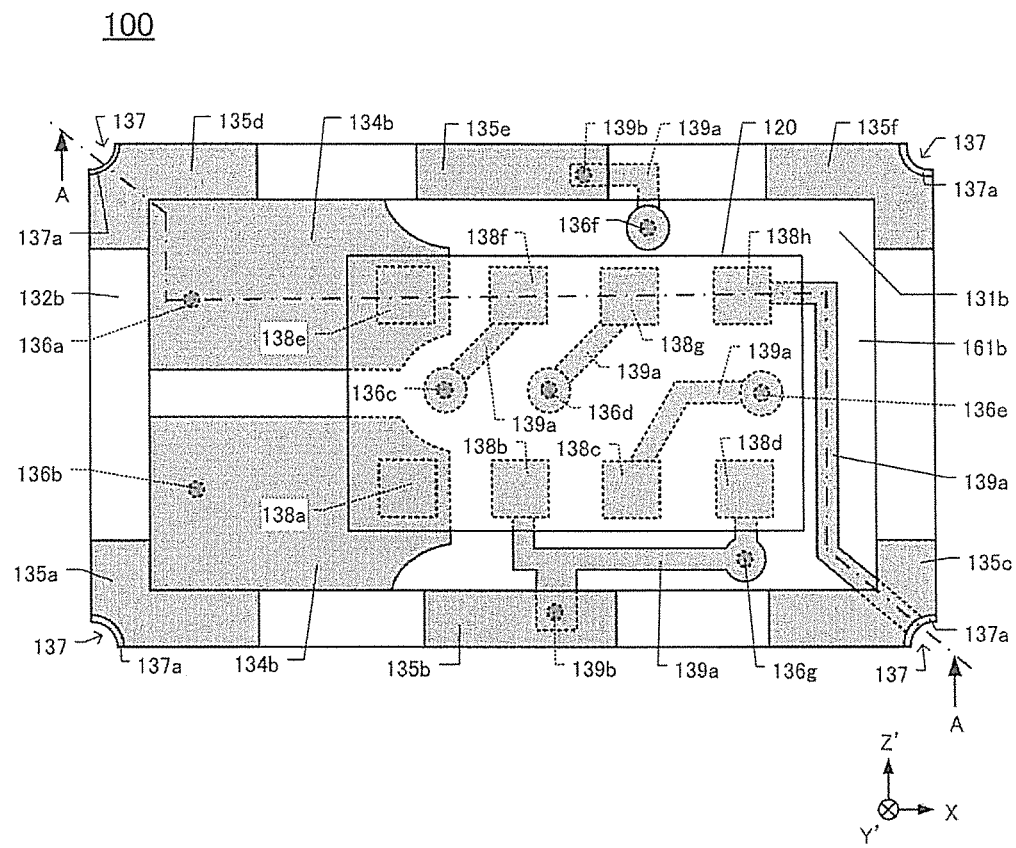
FIG. 3B is a bottom view illustrating the piezoelectric oscillator 100.

FIG. 3B is a bottom view illustrating the piezoelectric oscillator 100. At a peripheral area of an inferior surface of the piezoelectric oscillator 100, the mounting surface 132b is formed, and six mounting terminals 135a to 135f are disposed on the mounting surface 132b. At the center portion of the inferior surface, the second space 131b is formed, the second space 131b being depressed in the +Y'-axis direction from the mounting surface 132b. At the −X-axis and the −Z'-axis side of the mounting surface 132b, the mounting terminal 135a is disposed, and the mounting terminal 135b and the mounting terminal 135c are disposed with being sequentially arranged in the +X-axis direction from the mounting terminal 135a. Also, the −X-axis and the +Z'-axis side of the mounting surface 132b, the mounting terminal 135d is disposed, and the mounting terminal 135e and the mounting terminal 135f are disposed with being sequentially arranged in the X-axis direction from the mounting terminal 135d. The mounting terminal 135a is connected to a positive supply voltage (Vcc). Also, the mounting terminal 135b is an electrode to be grounded; the mounting terminal 135c is an electrode which outputs a signal of a MHz band frequency; the mounting terminal 135d an electrode which receives a control voltage for selecting the active state or the pause state; the mounting terminal 135e is an electrode which outputs a frequency of 32.768 kHz; and the mounting terminal 135f is an electrode to be grounded.

At corners at the −X-axis and the +Z'-axis side, and −X-axis and the −Z'-axis side of the ceiling surface 161b, frequency checking terminals 134b are respectively disposed. The respective frequency checking terminals 134b are disposed with contacting a long side of the ceiling surface 161b extending in the X-axis direction, and a short side of the ceiling surface 161b extending in the Z'-axis direction. Also, the respective frequency checking terminals 134b are adjacent to each other in the Z'-axis direction with not contacting to each other.

FIG. 3B illustrates, with the dotted lines, the electrodes 138a to 138h, which are disposed on the ceiling surface 161b of the second space 131b, the electrodes 138a to 138h being viewed through the integrated circuit 120. The electrode 138a and the electrode 138e are respectively connected to the crystal terminals 121 of the integrated circuit 120 via the bumps 153, and are respectively formed as parts of the frequency checking terminals 134b. The electrode 138b and the electrode 138d are both connected to the grounding terminals 125 of the integrated circuit 120 and the mounting terminal 135b. The electrode 138f is connected to the power source terminal 122 of the integrated circuit 120, and the mounting terminal 135a. The electrode 138g is connected to the switching terminal 123 of the integrated circuit 120, and the mounting terminal 135d. The electrode 138h is electrically connected to the MHz band output terminal 124 of the integrated circuit 120, and is connected to the mounting terminal 135c via a wiring electrode 139a and the side surface electrode 137a. The electrode 138c is connected to the 32.768 kHz output terminal 126 of the integrated circuit 120, and the mounting terminal 135e.

Figure 4A:
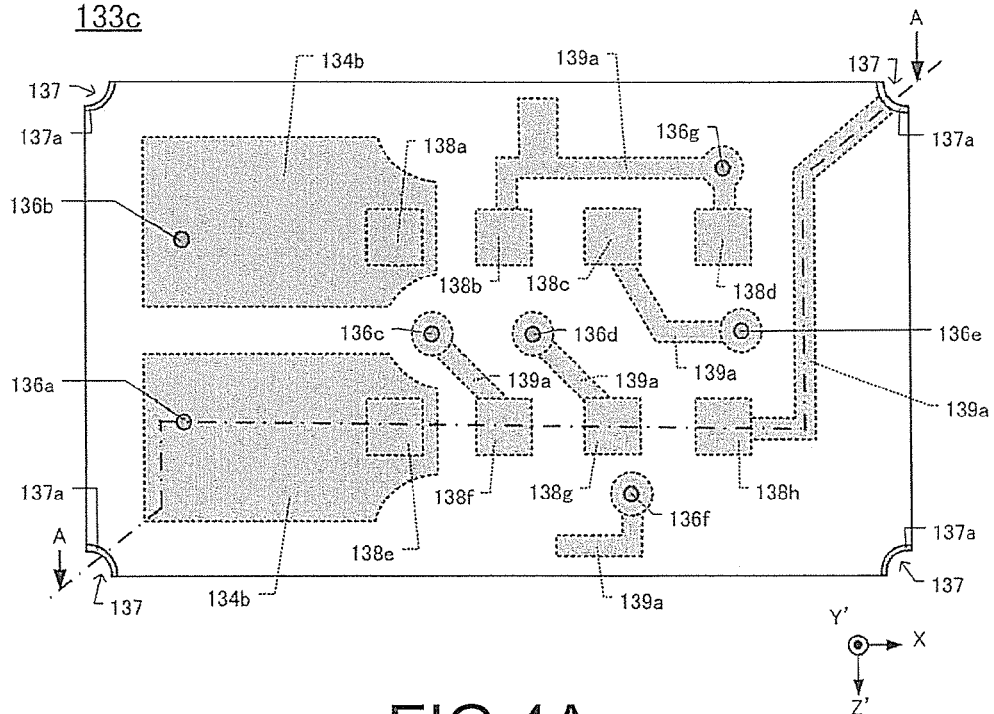
FIG. 4A is a plan view illustrating a third layer 133c where electrodes disposed on a surface of the third layer 133c at the −Y'-axis side are viewed from the +Y'-axis side through the third layer 133c.

FIG. 4A is a plan view illustrating the third layer 133c, the plan view illustrating the electrodes disposed on the surface at the −Y'-axis side of the third layer 133c, the electrodes being viewed from the +Y'-axis side through the third layer 133c. On the third layer 133c, seven third layer through electrodes 136a to 136g are disposed, the third layer through electrodes passing through the third layer 133c. The frequency checking terminal 134b at the +Z'-axis side of the third layer 133c is electrically connected to the third layer through electrode 136a which passes through the third layer 133c. The frequency checking terminal 134b at the −Z'-axis side of the third layer 133c is electrically connected to the third layer through electrode 136b, which passes through the third layer 133c. The electrode 138b and the electrode 138d are both electrically connected to the third layer through electrode 136g. In addition, the electrode 138b and the electrode 138d are both electrically connected to the mounting terminal 135b via a fourth layer through electrode 139b which passes through the wiring electrode 139a and the fourth layer 133d (see FIG. 3B). The electrode 138c is electrically connected to the third layer through electrode 136e via the wiring electrode 139a. The electrode 138f is electrically connected to the third layer through electrode 136c via the wiring electrode 139a. The electrode 138g is electrically connected to the third layer through electrode 136d via the wiring electrode 139a. Also, near the +Z'-axis side of the third layer 133c, the third layer through electrode 136f is disposed. The third layer through electrode 136f is electrically connected to the mounting terminal 135e via the wiring electrode 139a and fourth layer through electrode 139b which passes through the fourth layer 133d (see FIG. 3B).

Figure 4B:
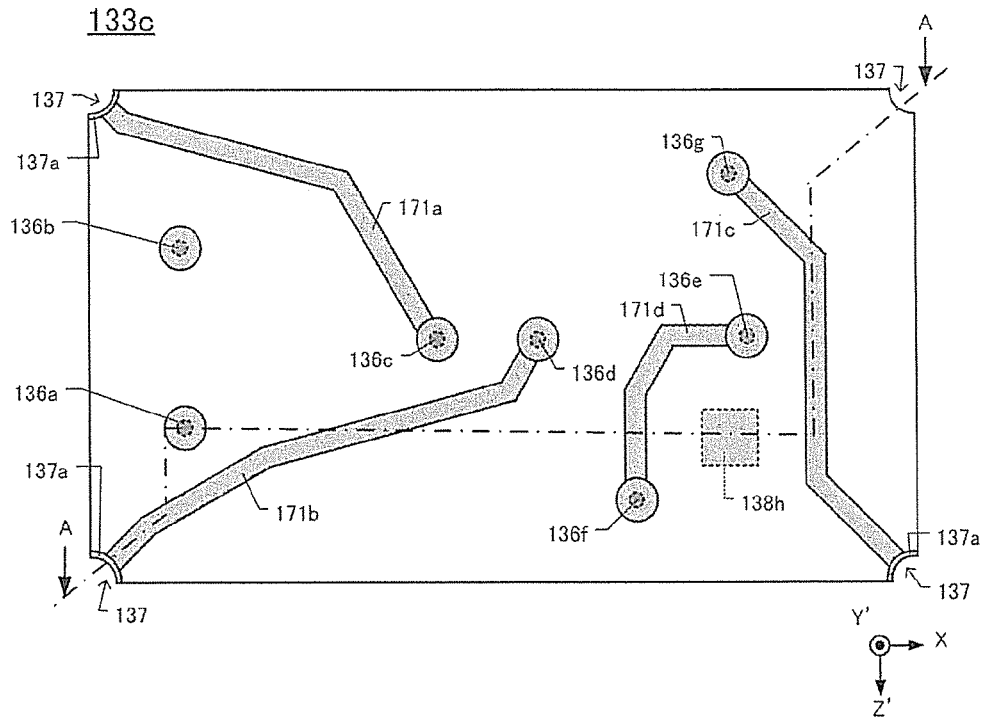
FIG. 4B is a plan view illustrating the third layer 133c.

FIG. 4B is a plan view illustrating the third layer 133c. FIG. 4B illustrates the electrodes disposed on the surface at the +Y'-axis side of the third layer 133c. The third layer through electrode 136c is electrically connected to the side surface electrode 137a via the first wiring electrode 171a, the side surface electrode 137a being disposed at the −X-axis and the −Z'-axis side of the third layer 133c. This electrically connects the electrode 138f to the mounting terminal 135a (see FIG. 3B). The first wiring electrode 171a has a portion overlapping, in the Y'-axis direction, the frequency checking terminal 134b at the −Z'-axis side (see FIG. 4A).

Third layer through electrode 136d is electrically connected to the side surface electrode 137a via a second wiring electrode 171b, the side surface electrode 137a being disposed at the −X-axis and the +Z'-axis side of the third layer 133c. This electrically connects the electrode 138g to the mounting terminal 135d (see FIG. 3B). The second wiring electrode 171b has a portion overlapping, in the Y'-axis direction, the frequency checking terminal 134b at the +Z'-axis side (see FIG. 4A).

The third layer through electrode 136g is electrically connected to the side surface electrode 137a via a third wiring electrode 171c, the side surface electrode 137a being disposed at the +X-axis and the +Z'-axis side of the third layer 133c. This electrically connects both the electrode 138b and the electrode 138d to the mounting terminal 135f (see FIG. 3B). In addition, the third layer through electrode 136a and the third layer through electrode 136b are respectively electrically connected to the connecting terminals 134a via the through electrodes which pass through the second layer 133b (see FIG. 2).

The third layer through electrode 136e is electrically connected to the third layer through electrode 136f via the fourth wiring electrode 171d. The fourth wiring electrode 171d is disposed without overlapping the electrode 138h and the wiring electrode 139a in the Y'-axis direction, the electrode 138h being indicated by a dotted line in FIG. 4B, and the electrode 138h being connected to the wiring electrode 139a (see FIG. 4A). In an oscillator which outputs signals having more than one frequencies, the wirings, which transmits signals having different frequencies, may overlap each other in the Y'-axis direction, which generates interference between the signals, resulting in unstable outputs. The piezoelectric oscillator 100 has a configuration in which the fourth wiring electrode 171d which transmits a signal having a frequency of 32.768 kHz does not overlap the electrode 138h and the wiring electrode 139a connected to the electrode 138h, which transmit a signal having a MHz band frequency, in the Y'-axis direction. This prevents interference between the signals and unstable output.

Figure 5:
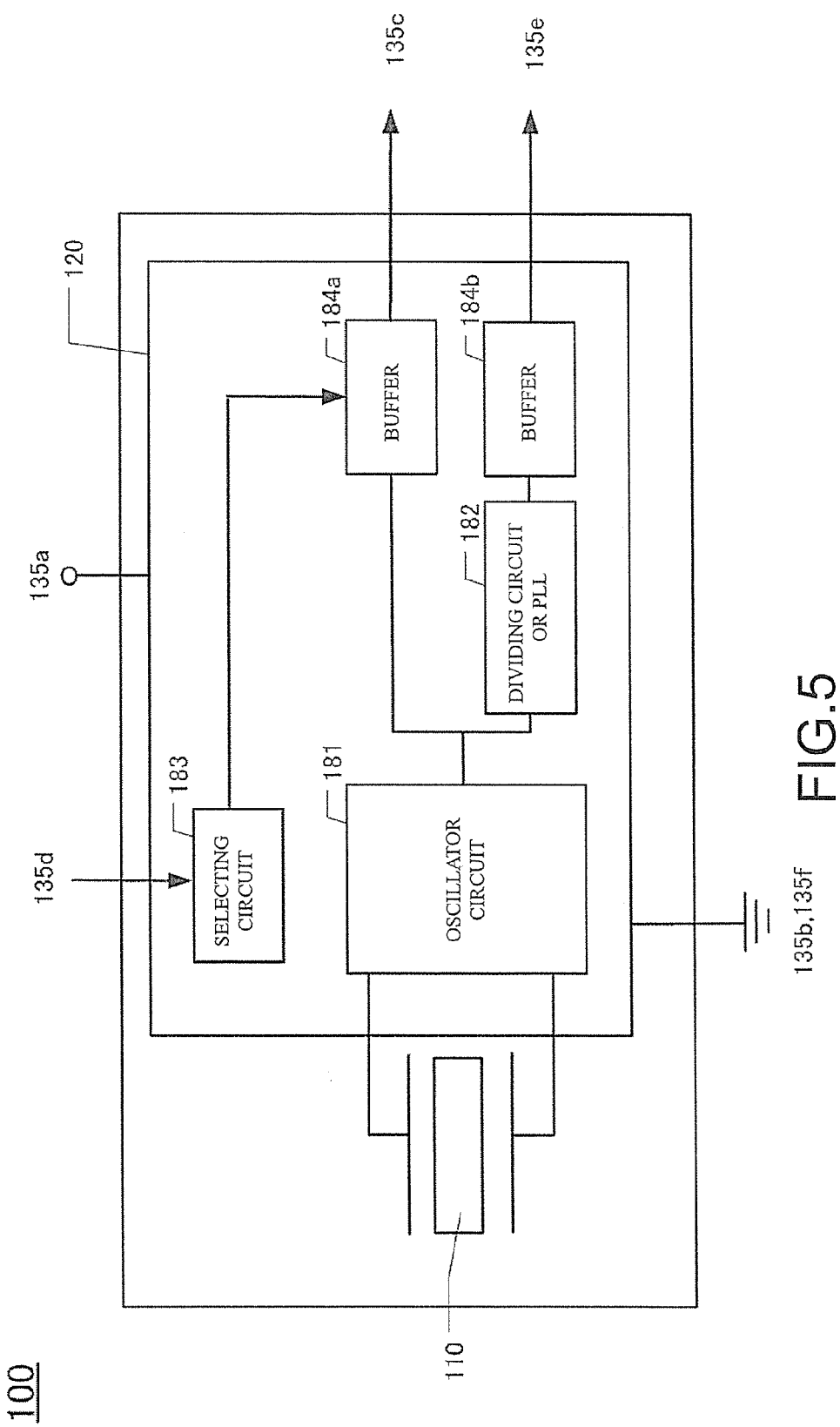
FIG. 5 is a circuit diagram of the piezoelectric oscillator 100.

FIG. 5 is a circuit diagram of the piezoelectric oscillator 100. The circuit of the piezoelectric oscillator 100 mainly includes the piezoelectric vibrating piece 110 and the integrated circuit 120. The piezoelectric vibrating piece 110 is connected to an oscillator circuit 181 of the integrated circuit 120 to generate a signal of a MHz band frequency. A frequency of the piezoelectric vibrating piece 110 is inversely proportional to the thickness of the piezoelectric vibrating piece 110, accordingly the frequency is mainly controlled by, for example, adjusting the thickness of the piezoelectric vibrating piece 110. A signal having a frequency generated in the oscillator circuit 181 is output from the mounting terminal 135c via a buffer 184a.

Incidentally, a signal of MHz band frequency generated by the oscillator circuit 181 is divided into a signal of 32.768 kHz frequency by a dividing circuit 182, and the divided signal of 32.768 kHz is output from the mounting terminal 135e via a buffer 184b. Thus, the piezoelectric oscillator 100 can output a signal of MHz band frequency and a signal of 32.768 kHz frequency. Although the dividing circuit 182 is used in the integrated circuit 120 in the above-described description, a Phase Locked Loop (PLL) circuit may be used instead of the dividing circuit 182.

Further, the piezoelectric oscillator 100 can restrict outputting a signal of MHz band frequency when a signal of MHz band frequency is not used. In the integrated circuit 120, the buffer 184a, which outputs a signal of MHz band frequency, is connected to a selecting circuit 183 for restricting a signal of that frequency. The selecting circuit 183 restricts a signal having the frequency output from the buffer 184a with response to a control voltage which is applied from the mounting terminal 135d. In addition, the integrated circuit 120 is respectively electrically connected to the mounting terminal 135a, the mounting terminal 135b, and the mounting terminal 135f.

Fabrication Method of Piezoelectric Oscillator 100

Figure 6:
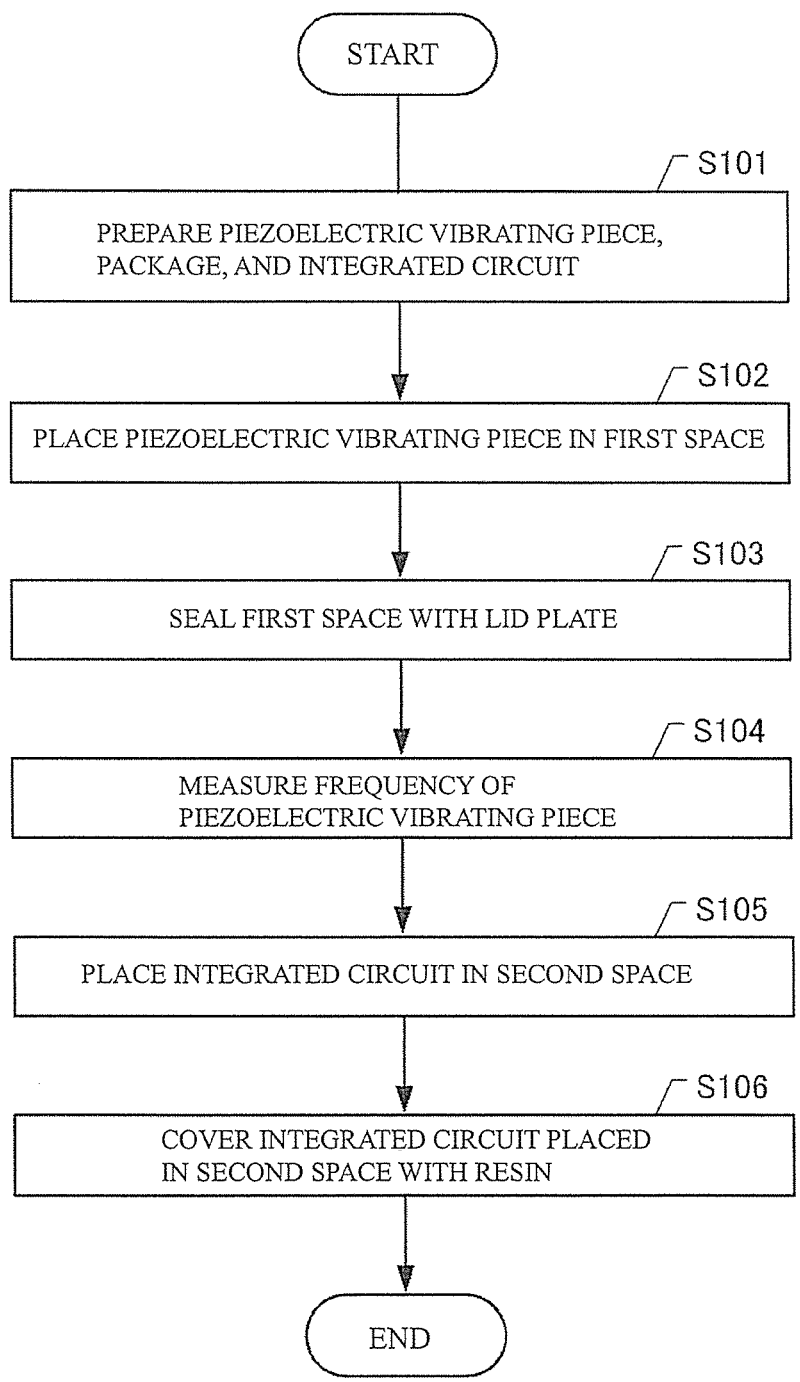
FIG. 6 is a flowchart of a fabrication method of the piezoelectric oscillator 100.

FIG. 6 is a flowchart of a fabrication method of the piezoelectric oscillator 100. The following description describes a method for fabricating the piezoelectric oscillator 100 with reference to FIG. 6.

In the step S101, the piezoelectric vibrating piece 110, the package 130, and the integrated circuit 120 are prepared. The piezoelectric vibrating piece 110 is prepared by, for example, forming a plurality of piezoelectric vibrating pieces 110 on an AT-cut quartz-crystal wafer (not illustrated), and then taking out each piezoelectric vibrating piece 110 from the quartz-crystal wafer. Incidentally, the package 130 is formed by stacking a plurality green sheets, and then sintering the stack of the green sheets.

In the step S102, the piezoelectric vibrating piece 110 is placed in the first space 131a of the package 130. The piezoelectric vibrating piece 110 is placed on the bottom surface 161a such that the connecting terminal 134a is electrically connected to the extraction electrode 112 via the conductive adhesive 152.

In the step S103, the first space 131a is sealed with the lid plate 140. The first space 131a is sealed by placing the lid plate 140 on the bonding surface 132a via the sealing material 151 with keeping vacuum in the first space 131a or filling the first space 131a with an inert gas.

In the step S104, a frequency of the piezoelectric vibrating piece 110 is measured. A frequency of the piezoelectric vibrating piece 110 is measured with probes 191 respectively contacting a pair of the frequency checking terminals 134b.

Figure 7A:
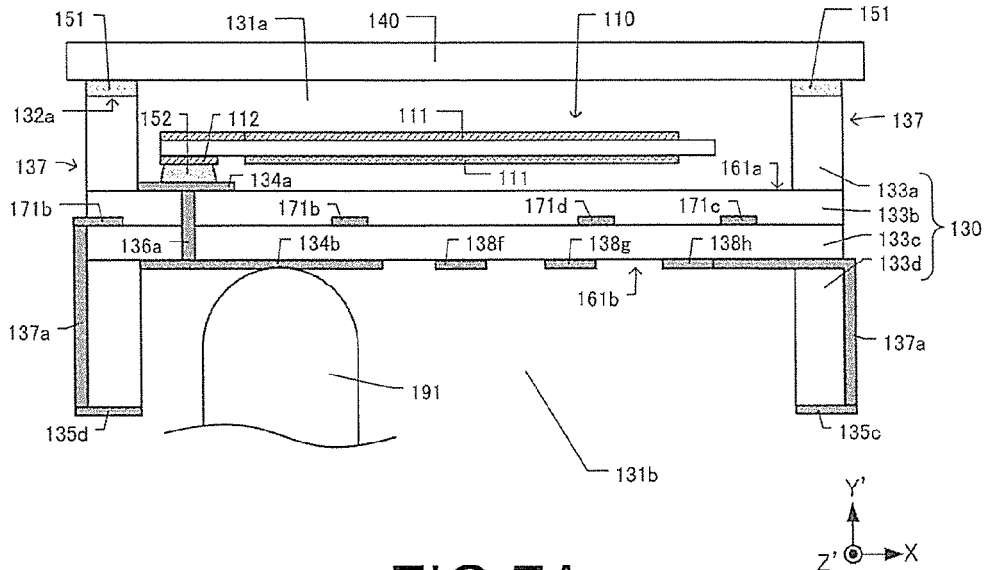
FIG. 7A is a cross-sectional view illustrating the piezoelectric oscillator 100 during the measurement of a frequency of the piezoelectric vibrating piece 110.

FIG. 7A is a cross-sectional view illustrating the piezoelectric oscillator 100 during the measurement of a frequency of the piezoelectric vibrating piece 110. The frequency of the piezoelectric vibrating piece 110 is measured before the integrated circuit 120 is placed in the second space 131b. FIG. 7A illustrates the probe 191 contacting the frequency checking terminal 134b.

Recent downsizing of a piezoelectric oscillator also decreases the sizes of a package and a frequency checking terminal. On the other hand, the probe keeps the same size, which causes the probe to inappropriately contact the frequency checking terminal, or contact wrong terminals. This disadvantageously prevents the probe from accurately measuring a frequency of the piezoelectric vibrating piece. In the piezoelectric oscillator 100, the frequency checking terminals 134b are disposed at the corners of the ceiling surface 161b of the second space 131b, accordingly the probe 191 can easily identify contacting positions of the frequency checking terminals 134b using a target, which is the side surface of the second space 131b. This causes the probe 191 to easily contact the frequency checking terminal 134b without contacting the wrong terminals. In addition, in the piezoelectric oscillator 100, wirings are placed via the surface at the +Y'-axis side of the third layer 133c. This increases the areas of the frequency checking terminals 134b, which also causes the probe 191 to easily contact the frequency checking terminal 134b.

Returning to FIG. 6, in the step S105, the integrated circuit 120 is placed in the second space 131b. The integrated circuit 120 is placed on the ceiling surface 161b such a way as to respectively bond, via the bump 153, the terminals 121 to 126 of the integrated circuit 120 to the electrodes 138a to 138h, which are disposed on the ceiling surface 161b.

In the step S106, the integrated circuit 120 placed in the second space 131b is covered with the resin 154.

Figure 7B:
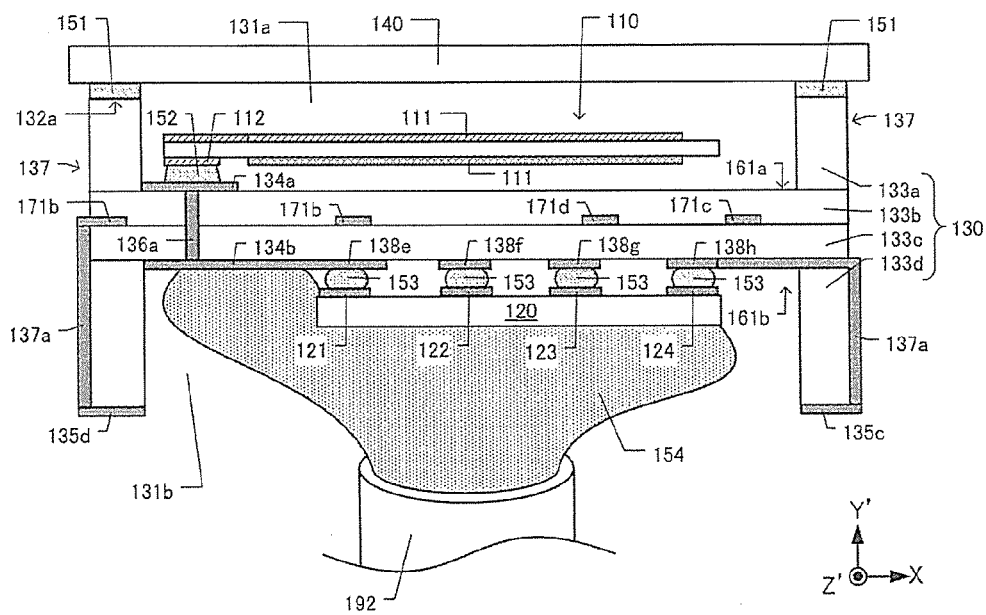
FIG. 7B is a cross-sectional view illustrating the piezoelectric oscillator 100 when a second space 131b is being filled with a resin 154.

FIG. 7B is a cross-sectional view illustrating the piezoelectric oscillator 100 when the second space 131b is being filled with the resin 154. The insulating resin 154 is injected from a nozzle 192 toward the second space 131b so as to cover the integrated circuit 120, and then is solidified to be the resin 154. For example, a thermosetting epoxide-based resin is used as the resin 154. The anti-shock property of the piezoelectric oscillator 100 can be enhanced by forming the resin 154 in the second space 131b.

Also, in a conventional approach, the resin 154 unfortunately cannot reach the ceiling surface 161b to cover the integrated circuit 120 in the step S106. This is because, the integrated circuit is placed at the center of the ceiling surface in a conventional piezoelectric oscillator, which narrows a gap between the side surface of the second space and the integrated circuit, accordingly the resin with viscosity cannot pass through the gap between the side surface of the second space and the integrated circuit. In the piezoelectric oscillator 100, the integrated circuit 120 is placed at the +X-axis side of the ceiling surface, which makes a wide space between the −X-axis side of the integrated circuit 120 and the side surface of the second space. This causes the resin to reach the ceiling surface 161b by passing through the −X-axis side of the integrated circuit 120.

Above all, although the preferred embodiments of this disclosure are described, it is apparent to a person skilled in the art that various variations and modifications can be made within the scope of this disclosure.

In the above-described embodiment, a description is given to a piezoelectric oscillator which outputs signals having a plurality of frequencies, however this disclosure is applicable to a piezoelectric oscillator which outputs only one frequency signal. Also, in the above-described embodiment, an AT-cut quartz-crystal vibrating piece is used as a piezoelectric vibrating piece, however a BT-cut quartz-crystal vibrating piece which similarly vibrates in a thickness-shear vibration mode may be also used. Further, the piezoelectric vibrating pieces are basically applied to not only a quartz-crystal material but also to a bonded material including a lithium tantalite, a lithium niobate, and piezoelectric ceramic.

A piezoelectric oscillator according to a second aspect of the disclosure may further include castellations disposed at four corners of side surfaces of the package, the castellations being depressed toward an inside of the package. The control terminals may be are connected to the mounting terminals via the castellations.

In a piezoelectric oscillator according to a third aspect of the disclosure, the integrated circuit may be placed near another of the short sides of the ceiling surface, and the integrated circuit placed in the second space may be covered with a resin In a piezoelectric oscillator according to a fourth aspect of the disclosure, the integrated circuit may include an oscillator circuit, a dividing circuit, and a selecting circuit. The oscillator circuit is configured to cause the piezoelectric vibrating piece to oscillate at a MHz band frequency. The dividing circuit is configured to divide the MHz band frequency to generate a frequency of 32.768 kHz. The selecting circuit is configured to select a pause state or an active state while the frequency of 32.768 kHz is output. The MHz band frequency is not output in the pause state. The MHz band frequency is output in the active state. The control terminal may be configured to control the selecting circuit. The ceiling surface may include an output terminal for the frequency of 32.768 kHz and an output terminal for the frequency of the MHz band. The output terminal for the frequency of 32.768 kHz and the output terminal for the MHz band frequency may be connected to the mounting terminals via the top surface or the inferior surface of the third layer without overlapping one another.

The piezoelectric oscillator of this disclosure allows the easy measurement of a frequency of the piezoelectric vibrating piece, and may prevent a wrong measurement of the frequency.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:
1. A piezoelectric oscillator, comprising:
a piezoelectric vibrating piece having a flat rectangular shape, the piezoelectric vibrating piece including a pair of excitation electrodes and a pair of extraction electrodes disposed on principal surfaces of the piezoelectric vibrating piece, each of the extraction electrodes being extracted from each of the excitation electrodes to one side of the flat rectangular shape;
an integrated circuit configured to cause the piezoelectric vibrating piece to oscillate at a predetermined frequency; and
a package having a first space where the piezoelectric vibrating piece is placed, and a second space where the integrated circuit device is placed,
wherein the package includes: a first layer forming a side surface of the first space; a second layer disposed on an inferior surface of the first layer to form a bottom surface of the first space, a pair of connecting electrodes are disposed on the bottom surface, the pair of connecting electrodes being electrically connected to the respective extraction electrodes of the piezoelectric vibrating piece; a third layer disposed on the inferior surface of the second layer to form a ceiling surface of the second space, the integrated circuit being placed on the ceiling surface; and a fourth layer disposed on the inferior surface of the third layer to form a side surface of the second space, a plurality of mounting terminals are disposed on the inferior surface,
the ceiling surface of the second space as a portion of the inferior surface of the third layer has a rectangular shape surrounded by short sides and long sides, the ceiling surface including a pair of frequency checking terminals electrically connected to the connecting electrodes and one control terminal to control the integrated circuit,
the pair of the frequency checking terminals are adjacent to one another, the respective frequency checking terminals being disposed in contact with any of the long sides and one of the short sides, and
the control terminal is extracted to the top surface of the third layer, and then connected to one mounting terminal by a wiring electrode placed on the top surface of the third layer, and the wiring electrode overlap one of the frequency checking terminals in a vertical direction.
2. The piezoelectric oscillator according to claim 1, further comprising:

castellations disposed at four corners of side surfaces of the package, the castellations being depressed toward an inside of the package, wherein the control terminal is connected to one of the mounting terminals via one of the castellations.

3. The piezoelectric oscillator according to claim 1, wherein the integrated circuit is placed closer to another of the short sides of the ceiling surface, and the integrated circuit placed in the second space is covered with a resin.

4. The piezoelectric oscillator according to claim 1, wherein the integrated circuit includes:

an oscillator circuit configured to cause the piezoelectric vibrating piece to oscillate at a MHz band frequency;

a dividing circuit configured to divide the MHz band frequency to generate a frequency of 32.768 kHz; and a selecting circuit configured to select a pause state or an active state while the frequency of 32.768 kHz is output, the MHz band frequency being not output in the pause state, the MHz band frequency being output in the active state, wherein the control terminal is configured to control the selecting circuit, the ceiling surface includes an output terminal for the frequency of 32.768 kHz and an output terminal for the frequency of the MHz band, and the output terminal for the frequency of 32.768 kHz and the output terminal for the MHz band frequency are connected to the mounting terminals via the top surface or the inferior surface of the third layer without overlapping one another.

* * * * *